United States Patent [19]
Tagami

[11] Patent Number: 5,877,716
[45] Date of Patent: Mar. 2, 1999

[54] WORD LENGTH CONVERTOR

[75] Inventor: Shigeo Tagami, Tokyo, Japan

[73] Assignee: Sony Corporation, Japan

[21] Appl. No.: 810,812

[22] Filed: Mar. 6, 1997

[30] Foreign Application Priority Data

Mar. 28, 1996 [JP] Japan .................................. 8-097433

[51] Int. Cl.⁶ ................................................ H03M 3/02
[52] U.S. Cl. ........................................... 341/143; 341/118
[58] Field of Search .................................... 341/118, 143, 341/155

[56] References Cited

U.S. PATENT DOCUMENTS

| | | | |
|---|---|---|---|
| 3,706,944 | 12/1972 | Tewksbury | 341/143 |
| 4,371,850 | 2/1983 | Klement | 332/11 D |
| 4,746,899 | 5/1988 | Swanson et al. | 341/143 |
| 5,068,659 | 11/1991 | Sakaguchi | 341/143 |
| 5,191,331 | 3/1993 | Karema et al. | 341/131 |
| 5,243,345 | 9/1993 | Naus et al. | 341/143 |
| 5,625,358 | 4/1997 | Wilson et al. | 341/143 |
| 5,682,161 | 10/1997 | Ribner et al. | 341/143 |
| 5,701,124 | 12/1997 | Ichimura et al. | 341/143 |

*Primary Examiner*—Marc S. Hoff
*Attorney, Agent, or Firm*—Ronald P. Kananen; Rader, Fishman & Grauer

[57] ABSTRACT

In a digital-data processing unit provided by the present invention, the level of 1-bit digital audio data resulting from DELTA-SIGMA modulation is adjusted by means of a multiplier. A digital audio data signal with the level thereof adjusted then undergoes DELTA-SIGMA modulation carried out by a low-pass DELTA-SIGMA modulator. As a result, digital audio signal with the word length thereof restored to its original value is obtained. In this case, high-frequency noise included in the digital audio data is removed.

29 Claims, 6 Drawing Sheets

WORD LENGTH CONVERTOR

BACKGROUND OF THE INVENTION

1. Field of the Invention

The present invention relates to a word-length conversion apparatus for converting the word length of digital data. The present invention also relates to a data processing apparatus for carrying out predetermined processing on digital data by performing processing of the digital data along with predetermined processing data.

2. Description of the Related Art

As a technique for converting an audio signal into a digital signal, a DELTA-SIGMA method draws attention. With the DELTA-SIGMA method, a sampling output of an analog audio signal and a previous conversion output are processed and coded in order to convert the analog audio data into digital audio data with a word length of typically 1 bit.

By the way, in some cases, it is necessary to carry out level-adjustment processing even on 1-bit digital audio data obtained by using the DELTA-SIGMA method much like, for example, 16-bit digital audio data resulting from the ordinary linear quantization or the like.

As a technique for adjusting the level of 1-bit digital audio data, a method whereby the 1-bit digital audio data is multiplied by a level-adjustment coefficient (or level-adjustment data) is known as is the case with the adjustment of the level of 16-bit digital audio data.

In such a configuration, however, there is encountered a problem that the accuracy of digital audio data completing level adjustment is much deteriorated.

That is to say, when digital audio data is multiplied by a level-adjustment coefficient, the word length of the digital audio data is increased by a carry. For this reason, it is necessary to truncate as many low-order bits as bits representing the change in word length in order to restore the word length of the digital audio data to the original word length.

When the low-order bits are truncated, however, the accuracy of the digital audio data is deteriorated. In the case of 16-bit digital audio data, the deterioration of the accuracy is not a problem because the number of bits is large.

In the case of 1-bit digital audio data, on the other hand, since the number of bits is small, the accuracy is degraded substantially by the truncation of low-order bits. When 1-bit digital audio data is multiplied by a 16-bit level-adjustment coefficient, for example, it is necessary to truncate 16 low-order bits of the result of the multiplication. As a result, the accuracy of the data completing the level adjustment is considerably deteriorated.

It should be noted that this problem arises not only when level-adjustment processing is carried out on 1-bit digital audio data, but also when processing to eliminate a direct-current offset component or processing to change a frequency characteristic is performed. This is because, even when such processing is carried out, data for eliminating a direct-current offset component and data for changing a frequency characteristic must be added to the 1-bit digital audio data.

OBJECT AND SUMMARY OF THE INVENTION

It is thus an object of the present invention to provide a word-length conversion apparatus and a data processing apparatus which, by carrying out predetermined processing on few-bit digital data such as 1-bit data along with predetermined processing data, is capable of restoring the word length to its original value and not only lowering but also raising the level of the original signal without degrading the accuracy of the result of predetermined data processing carried out on the few-bit digital data.

The word-length conversion apparatus provided by the present invention changes the word length of digital audio data by means of a DELTA-SIGMA converter which has a characteristic capable of passing through only original signal components as an input/output characteristic thereof.

After performing predetermined processing on digital data by carrying out processing on the digital data along with predetermined processing data, the data processing apparatus provided by the present invention changes the word length of an output of the data processing by means of a DELTA-SIGMA modulator which has a characteristic capable of passing through only original signal components as an input/output characteristic thereof.

In the word-length conversion apparatus provided by the present invention, digital data undergoes DELTA-SIGMA modulation in the DELTA-SIGMA modulator. In the modulation, the word length of the digital data is converted into a predetermined word length. At that time, components other than original signal component included in the digital data are removed from it. Therefore, when the digital data is supplied to the DELTA-SIGMA modulator, the input level thereof can be set on the basis of the level of the original signal component. As a result, if the level of the original signal component is lower than the maximum input level of the DELTA-SIGMA modulator, it is possible not only to lower the level of the signal component, but also to raise the level thereof.

In addition, in the data processing apparatus provided by the present invention, digital data undergoes predetermined data processing through processing along with predetermined processing data. Thereafter, the output of the processing undergoes DELTA-SIGMA modulation in the DELTA-SIGMA modulator. As a result, the word length of digital data can be changed to a predetermined word length.

At that time, components other than original signal component included in the digital data are removed from it. Therefore, when the digital data is supplied to the DELTA-SIGMA modulator, the input level thereof can be set on the basis of the level of the original signal component. As a result, if the level of the original signal component is lower than the maximum input level of the DELTA-SIGMA modulator, it is possible not only to lower the level of the signal component, but also to raise the level thereof.

BRIEF DESCRIPTION OF THE DRAWINGS

The above and other objects, features as well as many of attendant advantages of the present invention will be readily appreciated as the same becomes better understood by reference to the following figures showing the embodiments of the present invention wherein.

DETAILED DESCRIPTION OF THE PREFERRED EMBODIMENTS

The present invention will become more apparent from the following detailed description of preferred embodiments with reference to the accompanying diagrams showing the embodiments.

First of all, a first embodiment is explained. It should be noted that, as a representative, a data processing apparatus of the present invention applied to a level adjusting apparatus for adjusting the level of digital audio data is explained.

To begin with, an overview of the first embodiment is explained. In order to solve problems encountered in the prior art, it is possible to think of a method whereby, typically, 1-bit digital audio data is multiplied by a level-adjustment coefficient and then the result of the multiplication is again supplied to a DELTA-SIGMA modulator in order to restore the 1-bit digital audio data. This is because, by carrying out this processing, the word length of the digital audio data can be changed without discarding low-order bits thereof.

With such a scheme, however, even if the level of a signal component in an audible band is lower than the maximum input level of the DELTA-SIGMA modulator for changing word-length, the level of the signal component is lowered by the level-adjustment processing in many cases.

That is to say, if a high-order modulator capable of preserving a sufficiently satisfactory signal-to-noise ratio even in the audible band is used as a DELTA-SIGMA modulator for restoring the digital audio data, the maximum degree of modulation Mmax of the DELTA-SIGMA modulator becomes smaller than unity (100%). It should be noted that the signal-to-noise ratio is referred to hereafter simply as an S/N ratio.

Here, the maximum degree of modulation Mmax is defined as a ratio of the maximum input level ILmax to the maximum output level OLmax of the DELTA-SIGMA modulator expressed by Eq. (1) as follows:

$$M\text{max}=IL\text{max}/OL\text{max} \quad (1)$$

When supplying a signal to the DELTA-SIGMA modulator for restoring digital audio data, on the other hand, only a signal up to the maximum input level ILmax which prescribed by the maximum degree of modulation Mmax can be input. This is because, if a signal equal to or higher than the maximum input level ILmax is supplied, the noise distortion factor (referred to hereafter simply as 'THD+N') is deteriorated considerably, inevitably causing the DELTA-SIGMA modulator to oscillate.

The maximum degree of modulation Mmax varies dependently upon the transfer function of the DELTA-SIGMA modulator. Now, let the maximum degree of modulation Mmax be 0.5 (50%). In this case, only a signal with a level up to about 0.5 (50%) of the output level (±1) of the DELTA-SIGMA modulator can be supplied thereto. That is to say, only a signal with a level of up to ±0.5 (50%) can be supplied.

When digital audio data is supplied to the DELTA-SIGMA modulator for changing the word length thereof, if the data includes only a signal component in the audible band, the input level of the digital audio data supplied to the DELTA-SIGMA modulator can be set on the basis of the level of the signal component. As a result, in this case, if the level of the signal component in the audible band prior to the level adjustment is lower than the maximum input level ILmax of the DELTA-SIGMA modulator, it is possible not only to lower the level of the signal component, but also to raise the level thereof.

Figure 2:
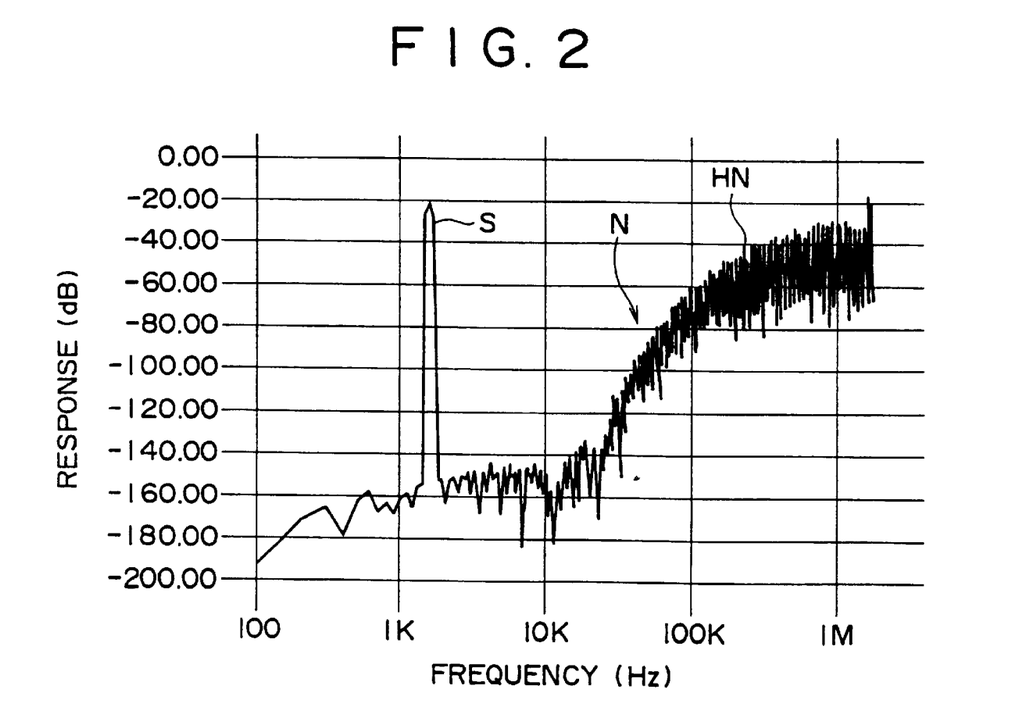
FIG. 2 is a diagram showing a spectrum of digital audio data resulting from DELTA-SIGMA modulation.

However, the digital audio signal resulting from the DELTA-SIGMA modulation includes quantization noise N. As shown in FIG. 2, the higher the frequency, the higher the level of the quantization noise N. In addition, the level of quantization noise N having a high frequency is normally the maximum input level ILmax of the DELTA-SIGMA modulator and also higher than the level of the signal component S in the audible band. Quantization noise N having a high frequency is called high-frequency noise HN. This characteristics are common to all DELTA-SIGMA modulators even though they may vary to a certain degree from modulator to modulator. It should be noted that the horizontal and vertical axes shown in FIG. 2 represent the frequency and response respectively.

For this reason, in many cases, the setting of the input level of digital audio data supplied to the DELTA-SIGMA modulator for restoring data must be based on the level of the high-frequency noise HN instead of being based on the level of the signal component S in the audible band. In this way, the level of the component signal S in the audible band can be lowered even if the level of the component signal S in the audible band prior to the level adjustment is lower than the maximum input level ILmnax as long as the level of the high-frequency noise HN is higher than the maximum input level ILmax.

Figure 3:
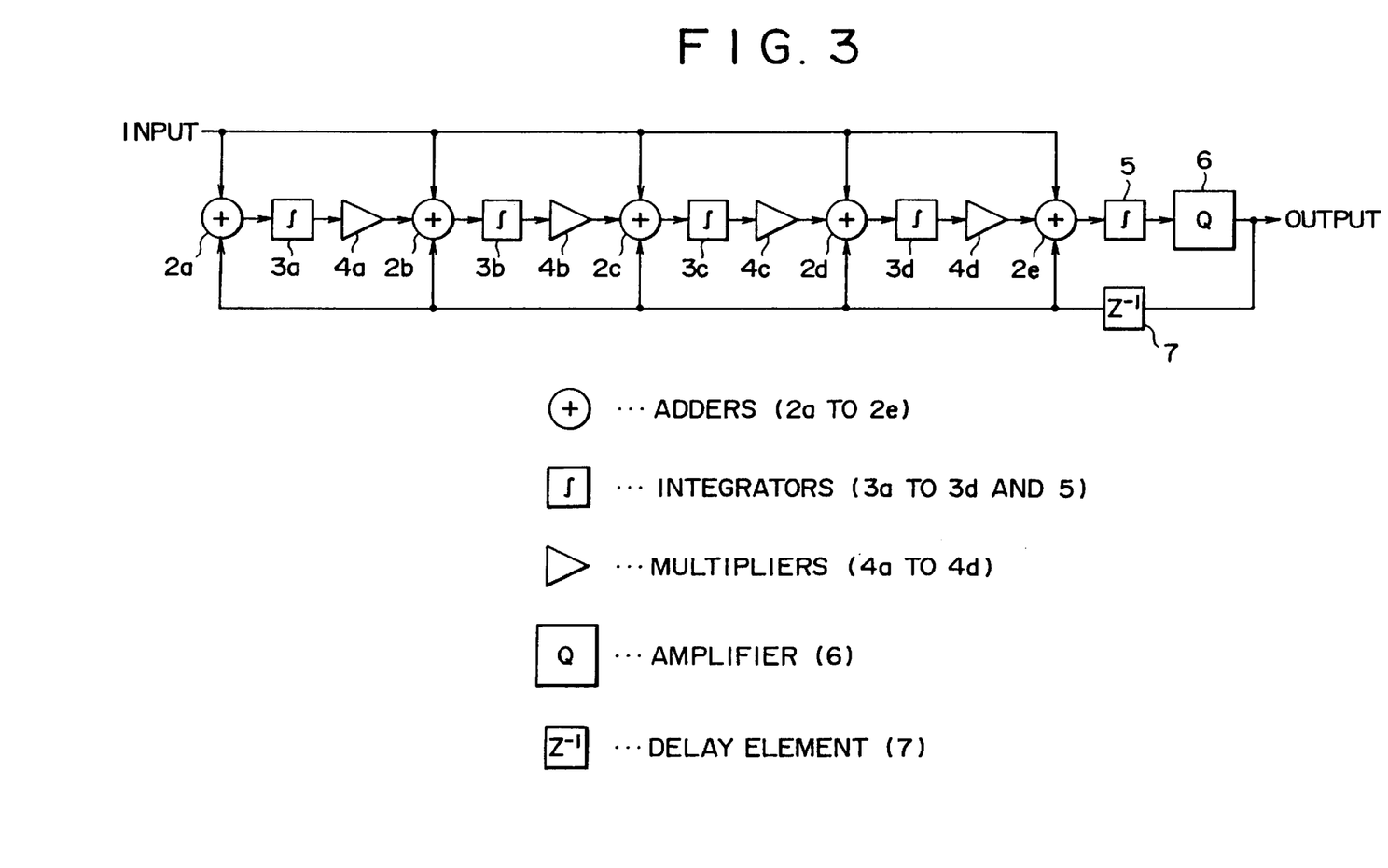
FIG. 3 is a block diagram used for explaining an overview of the first embodiment.
Figure 4:
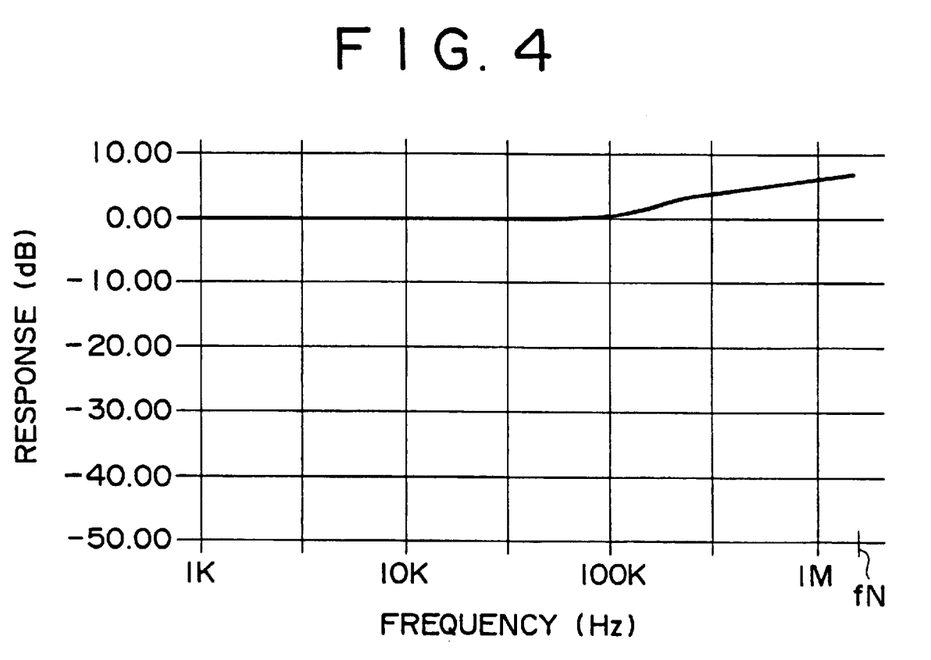
FIG. 4 is a characteristic diagram used for explaining the overview of the first embodiment.

Moreover, in many cases, the input/output frequency characteristic of the DELTA-SIGMA converter is not flat up to the Nyquist frequency fN. In the case of a DELTA-SIGMA modulator comprising adders 2a to 2e, integrators 3a to 3d and 5 multipliers 4a to 4d, an amplifier 6 and a delay element 7 as shown in FIG. 3, for example, the input/output frequency thereof is such a frequency with a large gain over a range from several kilohertz to the Nyquist frequency fN as shown in FIG. 4.

For this reason, when DELTA-SIGMA modulation is carried out on an input signal including high-frequency noise HN with a high level like the one described above, the level of the high-frequency noise HN is further raised, exceeding the maximum degree of modulation with ease. As a result, since the level-adjustment coefficient must be decreased, the level of the signal component S in the audible band is lowered, causing the signal-to-noise ratio (S/N ratio) to deteriorate.

Such a problem can be solved by supplying 1-bit digital audio data to the DELTA-SIGMA modulator for restoring data after removing high-frequency noise HN from the 1-bit digital audio data.

However, such a configuration has a problem that the scale of the circuit becomes large. This is because the scale of the circuit of the digital filter employed therein is large.

On the top of that such a configuration has another problem that the processing carried out by the digital filter is complex in addition to a noise problem and a problem caused by a large amount of consumed power. This is because the amount of processing is huge due to the fact that the transfer rate of digital audio data resulting from the DELTA-SIGMA modulation is several ten of times the transfer rate of 16-bit digital audio data resulting from the resulting from the normal linear quantization or the like.

In addition, such a configuration has still another problem that there is a fair chance for the quality of the image to deteriorate. This is because the filtering process carried out by the digital filter results in ripples and rounding errors in the audible band.

In order to solve the problems described above, the present embodiment provides a level adjusting apparatus wherein, with the 1-bit digital audio data multiplied by a level-adjustment coefficient in processing to adjust the level carried out on the digital audio data, it is needless to say that the word length can be restored to the original value thereof without leading to degradation of the accuracy of the processing output and, in addition, for digital audio data with a level prior to the level adjustment lower than the maximum input level ILmax of the DELTA-SIGMA modulator, the level of the original signal component can be raised without using a digital filter.

Figure 1:
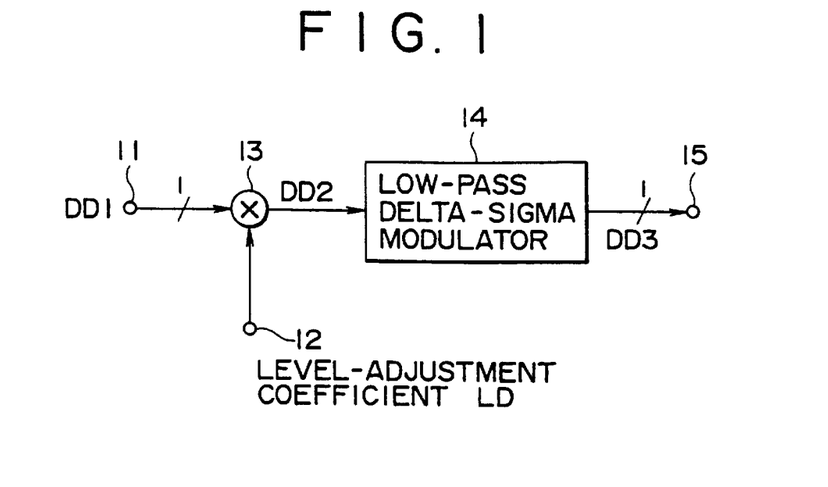
FIG. 1 is a block diagram showing the configuration of a data processing apparatus provided by a first embodiment of the present invention.

Next, the configuration of the present embodiment is explained. FIG. 1 is a block diagram showing the configuration of a data processing apparatus provided by the first embodiment of the present invention.

As shown in the figure, the data processing apparatus (to be more specific, the level adjusting apparatus) comprises a data input terminal 11, a coefficient input terminal 12, a multiplier 13, a low-pass DELTA-SIGMA modulator 14 and an output terminal 15.

Here, typically, digital audio data DD1 output by a DELTA-SIGMA modulator for coding, which is not shown in the figure, is supplied to the level adjusting apparatus by way of the data input terminal 11. The word length of the digital audio data DD1 is set at 1 bit for example. On the other hand, data of a coefficient LD for level adjustment is supplied to the level adjusting apparatus by way of the coefficient input terminal 12.

The multiplier 13 has a function for multiplying each bit of the digital audio data DD1 supplied to the level adjusting apparatus by way of the data input terminal 11 by the level-adjustment coefficient LD. The DELTA-SIGMA modulator 14 has a function for restoring digital audio data DD2 resulting from the multiplication carried out by the multiplier 13 into 1-bit digital audio data DD3 by modulation of the digital audio data DD2. The DELTA-SIGMA modulator 14 is the word-length conversion apparatus provided by the present invention. The 1-bit digital audio data DD3, the result of the restoration, is output to the output terminal 15.

The DELTA-SIGMA modulator 14 has a low-pass characteristic capable of removing high-frequency noise HN. Such a low-pass characteristic can be obtained by properly setting the transfer function of a feed-forward element and the transfer function of a feedback element.

Figure 5:
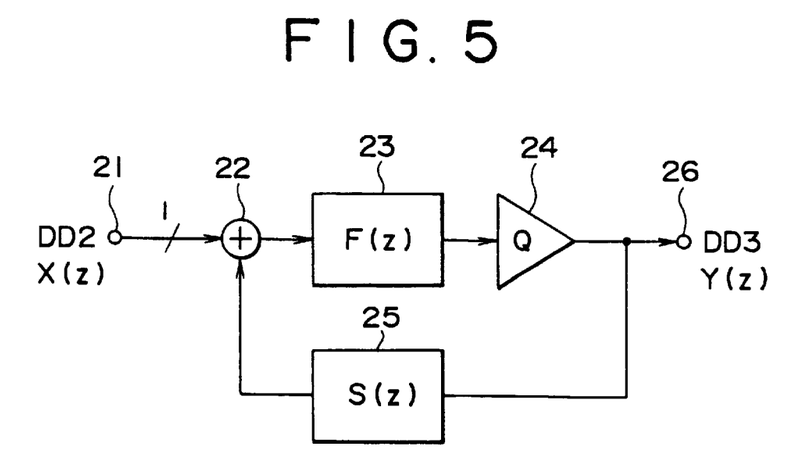
FIG. 5 is a block diagram showing a conceptual configuration of a DELTA-SIGMA modulator employed in the first embodiment.

To put it in detail, the DELTA-SIGMA modulator 14 comprises an input terminal 21, an adding element 22, a feed-forward element 23, an amplifying element 24, a feedback element 25 and an output terminal 26 as shown in FIG. 5.

The digital audio data DD2 is supplied to the DELTA-SIGMA modulator 14 by way of the input terminal 21. The adding element 22 has a function for finding the difference between the input digital audio data DD2 and the digital audio data DD3, a conversion output. The feed-forward element 23 has a function for converting the difference found by the adding element 22 into 1-bit data. The amplifying element 24 has a function for amplifying the 1-bit data output by the feed-forward element 23 into the digital audio data DD3. The feedback element 25 has a function for feeding back the digital audio data DD3 output by the amplifying element 24 as the conversion output cited above. The digital audio data DD3 is supplied to the output terminal 26.

The transfer function G(z) of the DELTA-SIGMA modulator 14 is expressed by Eq. (2) as follows:

$$\begin{aligned} G(z) &= Y(z)/X(z) \\ &= F(z) \cdot Q/\{1 + F(z) \cdot Q \cdot S(z)\} \end{aligned} \quad (2)$$

where reference notations X(z) and Y(z) are the input and output signals respectively, reference notation F(z) is the transfer function of the feed-forward element 23, reference notation Q is the gain of the amplifying element 24, reference notation S(z) is the transfer function of the feedback element 25, reference notation z is jω and reference notation ω is the angular speed.

The frequency characteristic is expressed as follows:

$$|F(z) \cdot Q|/|1 + F(z) \cdot Q \cdot S(z)|$$

In such a configuration, the frequency characteristic of the DELTA-SIGMA modulator 14 can be set as a low-pass characteristic by properly setting the transfer function F(z) of the feed-forward element 23 and the transfer function S(z) of the feedback element 25.

Figure 6:
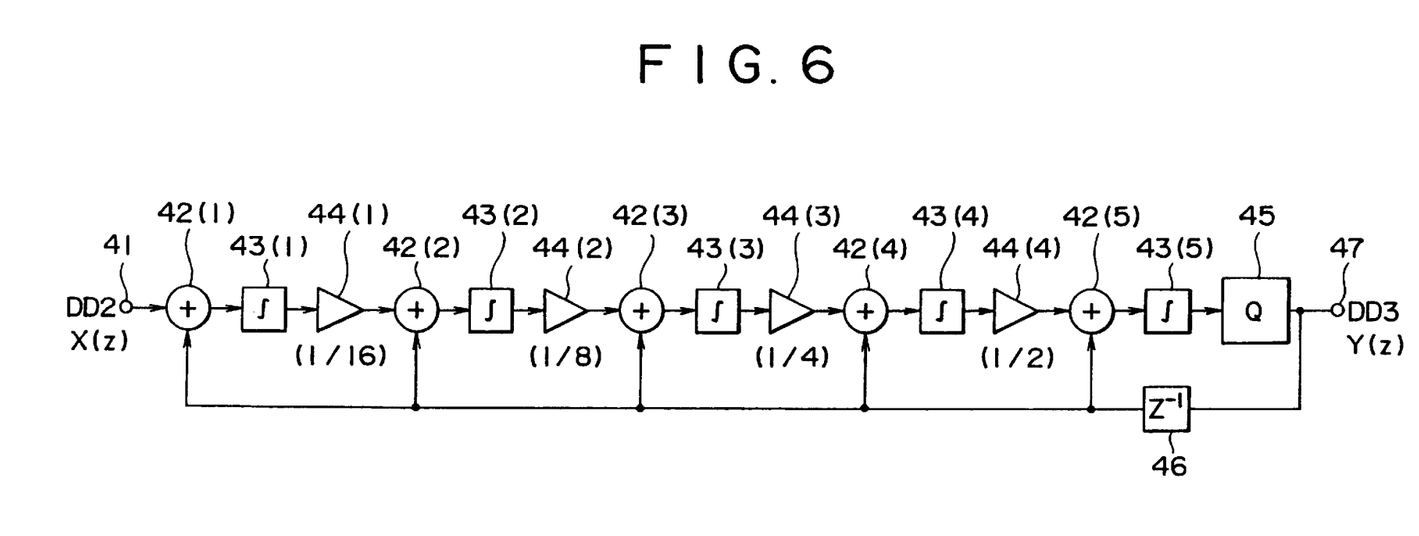
FIG. 6 is a block diagram showing a typical actual configuration of the DELTA-SIGMA modulator employed in the first embodiment.

FIG. 6 is a diagram showing a typical actual configuration of the DELTA-SIGMA modulator 14 having a low-pass characteristic. As shown in the figure, the DELTA-SIGMA modulator 14 comprises an input terminal 41, five two-input adders 42(1) to 42(5), five integrators 43(1) to 43(5), four coefficient multipliers 44(1) to 44(4), an amplifier 45, a delay element 46 and an output terminal 47.

The digital audio data DD2 output by the multiplier 13 is supplied to the input terminal 41. The two-input adders 42(1) to 42(5) each have a function for subtracting a signal supplied to one of the two input terminals thereof from a signal supplied to the other input signal. The integrators 43(1) to 43(5) each have a function for integrating an input signal supplied thereto.

The coefficient multipliers 44(1) to 44(4) each have a function for multiplying an input signal supplied thereto by a coefficient of ¹⁄₁₆, ⅛, ¼ or ½. The delay element 46 has a function for delaying an input signal supplied thereto by a 1-bit period. The digital audio data DD3, the word length of which has been restored to 1 bit is supplied to the output terminal 47.

Next, the interconnection of the elements is explained. The input terminal 41 is connected to one of the input terminals of the two-input adder 42(1). The output terminal of the adder 42(1) is connected to the input terminal of the integrator 43(1). The output terminal of the integrator 43(1) is connected to the input terminal of the coefficient multiplier 44(1). The output terminal of the coefficient multiplier 44(1) is connected to one of the input terminals of the two-input adder 42(2). Thereafter, the other elements up to the integrator 43(5) are connected to each other in the same way.

The output terminal of the integrator 43(5) is connected to the input terminal of the amplifier 45. The output terminal of the amplifier 45 is connected the output terminal 47 and the input terminal of the delay element 46. The output terminal of the delay element 46 is connected to the other input terminal of each of the adders 42(1) to 42(5).

Figure 7:
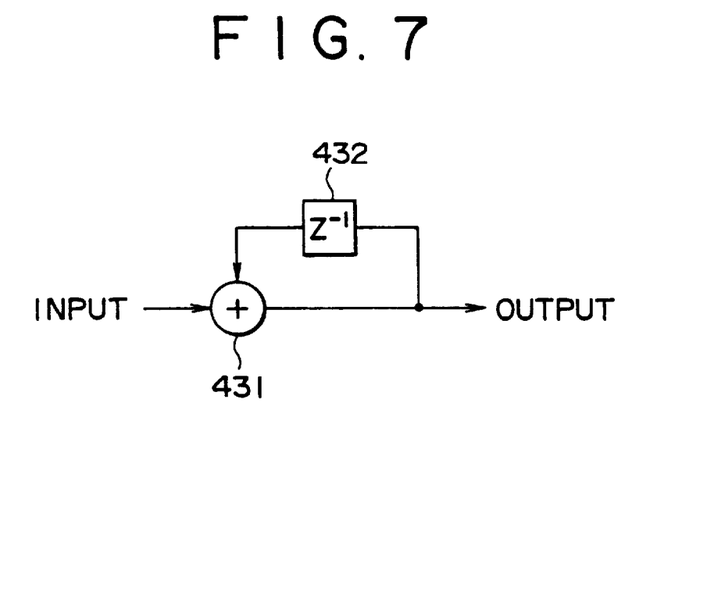
FIG. 7 is a block diagram showing a typical actual configuration of an integrator employed in the DELTA-SIGMA modulator shown in FIG. 6.

As shown in FIG. 7, the integrators 43(1) to 43(5) each comprise an adder 431 and a delay element 432.

Figure 8:
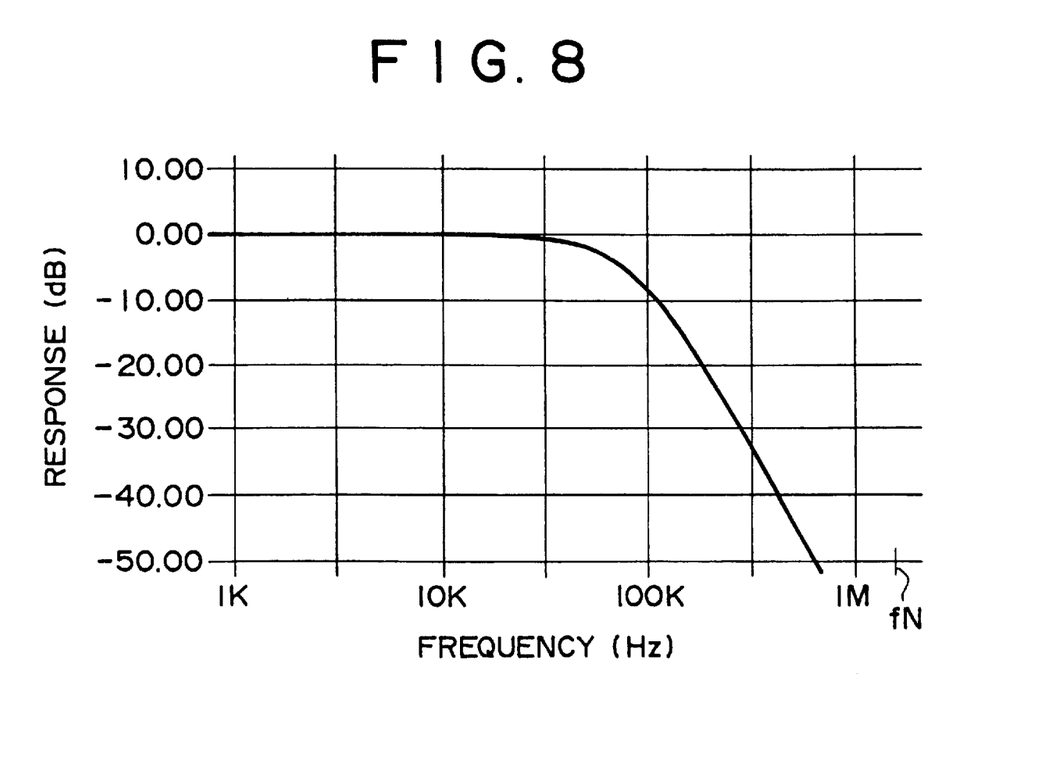
FIG. 8 is a characteristic diagram showing the frequency characteristic of the DELTA-SIGMA modulator employed in the first embodiment.

As shown in FIG. 8, the frequency characteristic of the DELTA-SIGMA modulator 14 shown in FIG. 6 is all but flat up to the upper-limit frequency of the audible band. The curve exhibits an attenuation characteristic in the frequency zone from the upper-limit frequency to the Nyquist frequency fN.

Next, the operation of the first embodiment having the configuration described above is explained.

(1) Operation of the Level Adjusting Apparatus

First of all, the operation of the level adjusting apparatus is explained by referring to FIG. 1.

Figure 9A:
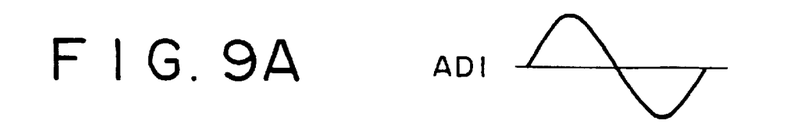
FIGS. 9A to 9D are signal-waveform diagrams used for explaining the operation of the first embodiment.

Digital audio data DD1 is supplied to the data input terminal 11. The digital audio data DD1 is obtained by carrying out DELTA-SIGMA modulation on an analog audio data AD1 shown in FIG. 9A. The word length of the digital audio data DD1 is set at 1 bit.

Figure 9B:
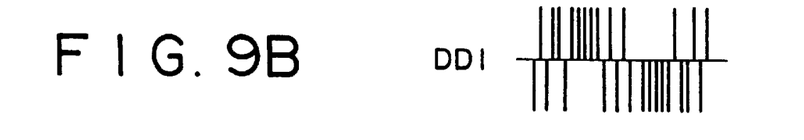

The digital audio data DD1 is shown in FIG. 9B. As shown in the figure, the digital audio data DD1 has "+1" and "−1" levels. Typically, the "+1" and "−1" levels correspond to the logic values "1" and "0" respectively.

The digital audio data DD1 received by way of the data input terminal 11 is supplied to the multiplier 13 to be multiplied by the level-adjustment coefficient LD. The multiplication results in digital audio data DD2 with the level thereof adjusted. The digital audio data DD2 is then supplied to the DELTA-SIGMA modulator 14.

Figure 9C:
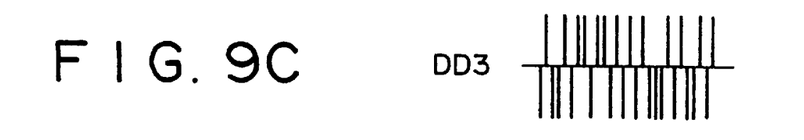

In the DELTA-SIGMA modulator 14, the digital audio data DD2 again undergoes DELTA-SIGMA modulation through integration, quantization and feedback processing. As a result, the word length which was extended in the level-adjustment processing is restored to the original value thereof. That is to say, the DELTA-SIGMA modulator 14 produces digital audio data DD3 with a word length restored to 1 bit. The digital audio data DD3 with a word length restored to 1 bit is shown in FIG. 9C.

Figure 9D:
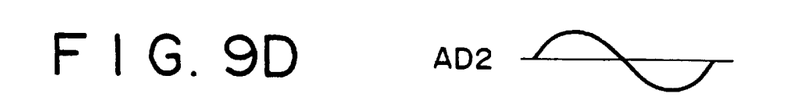

The digital audio data DD3 is supplied to a digital filter which is not shown in the figure by way of the output terminal 15. The digital filter restores the digital audio data DD3 the original analog audio data AD2 that is shown in FIG. 9D.

The digital audio data DD1 supplied to the input terminal 11 includes quantization noise N in addition to the signal component S in the audible band. As a result, the digital audio data DD2 output by the multiplier 13 also includes quantization noise N in addition to the signal component S in the audible band.

The level of high-frequency noise HN, the quantization noise N which has frequencies higher than the upper-limit frequency of the audible band, is normally higher than the level of the signal component S in the audible band. For this reason, if a DELTA-SIGMA modulator having a frequency characteristic like the one shown in FIG. 4 is employed as the DELTA-SIGMA modulator 14, the setting of the value of the level-adjustment coefficient LD must be based on the level of the high-frequency noise HN.

On the other hand, the DELTA-SIGMA modulator 14 provided by the present embodiment has a low-pass characteristic. The curve representing the low-pass characteristic is flat in the audible band and exhibits a gradually decreasing gain in a frequency zone from a frequency in close proximity to the upper-limit frequency of the audible band to the Nyquist frequency fN. Therefore, high-frequency noise HN supplied to the DELTA-SIGMA modulator 14 is eliminated thereby.

As a result, the value of the level-adjustment coefficient LD can be set by not much considering the level of the high-frequency noise HN. In other words, the value of the level-adjustment coefficient LD can be set by mainly taking the level of the signal component S in the audible band. In this way, the level-adjustment processing can solve the problem that the level of the signal component in the audible band always decreases.

That is to say, even in the case of the present embodiment, in the case of a signal component S in the audible band with a level prior to the level adjustment higher than the maximum input level ILmax of the DELTA-SIGMA modulator 14, the level-adjustment coefficient LD must be set at a value of smaller than unity. As a result, in this case, the level of the signal component S in the audible band is lowered by the level-adjustment processing.

In the case of a signal component S in the audible band with a level prior to the level adjustment equal to the maximum input level ILmax of the DELTA-SIGMA modulator 14, on the other hand, the level-adjustment coefficient LD must can be set at a value of equal to unity. As a result, in this case, the level of the signal component S in the audible band can be sustained as it is. As for the case of a signal component S in the audible band with a level prior to the level adjustment lower than the maximum input level ILmax of the DELTA-SIGMA modulator 14, the level-adjustment coefficient LD can be set at a value of greater than unity. As a result, in this case, the level of the signal component S in the audible band can be raised by the level-adjustment processing.

The level of a signal component S in the audible band prior to the level adjustment is explained through an example. Let the maximum degree of modulation Mmax of the DELTA-SIGMA modulator for coding and Mmax of the DELTA-SIGMA modulator 14 for changing the word length be both 0.5 (50%). In addition, let us assume that the level of the analog audio data AD1 is 0.5.

In this case, digital audio data DD1 with a degree of modulation M of 0.5 (50%) is supplied to the input terminal 11. That is to say, the digital audio data DD1 has a signal component S in the audible band with a level of 0.5. Here, the degree of modulation M in the DELTA-SIGMA modulator is a ratio of the input level IL of the DELTA-SIGMA modulator to the maximum output level OLmax thereof as expressed by Eq. (3) as follows:

$$M = IL/OL\text{max} \qquad (3)$$

Therefore, the level-adjustment coefficient LD can be set at a value of equal to or smaller than unity. This is because the maximum degree of modulation Mmax of the DELTA-SIGMA modulator 14 is set at 0.5 (50%). That is to say, this is because a signal component S in the audible band with a level of 0.5 can be input.

Now, let the value of the level-adjustment coefficient LD be set 0.5. In this case, the level of the signal component S in the audible band that can be input to the DELTA-SIGMA modulator 14 is 0.25 (=0.5×0.5). In this case, digital audio data DD3 with a degree of modulation M of 0.25 (=25%) is obtained at the output terminal 15.

That is to say, digital audio data DD3 including a signal component S in the audible band with a level of 0.25 is obtained. In this way, the level of the signal component S in the audible band is lowered from 0.5 to 0.25 by the level-adjustment processing. It should be noted that, by passing this digital audio data DD3 through a filter, the digital audio data DD3 can be restored to the analog audio data AD2 with a level of 0.25.

In addition, if the value of the level-adjustment coefficient LD is at 1.0, the level of the signal component S in the audible band supplied to the DELTA-SIGMA modulator 14 is 0.5 (=0.5×1). In this case, digital audio data DD3 with a degree of modulation M of 0.50 (=50%) is obtained at the output terminal 15.

That is to say, digital audio data DD3 including a signal component S in the audible band with a level of 0.50 is obtained. In this way, the level of the signal component S in the audible band is kept at 1.0 as it is by the level-adjustment processing. It should be noted that, in this case, the digital audio data DD3 can be restored to the analog audio data AD2 with a level of 0.50.

Next, with the maximum degrees of modulation Mmax of the two DELTA-SIGMA modulators kept as they are, the level of the analog audio data AD1 is set at 0.1. In this case, digital audio data DD1 with a degree of modulation M of 0.1 (10%) is supplied to the input terminal 11. That is to say, digital audio data DD1 including a signal component S in the audible band with a level of 0.1 is supplied. Thus, the level-adjustment coefficient LD can be set at a value of equal to or smaller than 5.0.

Now, if the value of the level-adjustment coefficient LD can be set at 4.0, the level of the signal component S in the audible band supplied to the DELTA-SIGMA modulator 14 is 0.4 (=0.1×4.0). In this case, digital audio data DD3 with a degree of modulation M of 0.4 (=40%) is obtained at the output terminal 15.

That is to say, digital audio data DD3 including a signal component S in the audible band with a level of 0.4 is obtained. In this way, the level of the signal component S in the audible band is raised from 0.1 to 0.4 by the level-adjustment processing. It should be noted that, in this case, the digital audio data DD3 can be restored to the analog audio data AD2 with a level of 0.4. What has been described so far is the operation of the level adjusting circuit shown in FIG. 1.

(2) Operation of the DELTA-SIGMA Modulator 14

Next, the operation of the DELTA-SIGMA modulator 14 shown in FIG. 6 is explained.

The digital audio data DD2 received by way of the input terminal 41 is supplied to the adder 42(1). At the adder 42(1), a conversion output leading by 1 sample from the delay element 46 is subtracted from each bit of the digital audio data DD2. The result of the subtraction is integrated by the integrator 43(1) before being multiplied by a multiplying coefficient of 1/16 by means of the multiplier 44(1). The product output by the multiplier 44(1) is supplied to the adder 42(2) for subtracting the conversion output cited above from the product.

Thereafter, the digital audio data DD2 undergoes the same subtraction, integration and multiplication processings which are carried out one after another before being amplified by the amplifier 45. In this way, the digital audio data DD3 with the word length thereof restored to 1 bit is obtained. After being delayed by 1 sampling period by means of the delay element 46, the digital audio data DD3 is supplied to the adders 42(1) to 42(5).

According to the embodiment described above in detail, the following effects can be realized.

In the first place, according to the present embodiment, by again supplying the digital audio data DD2 completing level-adjustment processing to the DELTA-SIGMA modulator 14, the digital audio data DD2 can be digital audio data DD3 with the word length thereof restored to 1 bit. As a result, the word length can be restored to the original value thereof without degrading the accuracy of the output of the level adjustment.

In the second place, according to the present embodiment, the DELTA-SIGMA modulator 14 for changing the word length is designed to exhibit a low-pass characteristic capable of eliminating high-frequency noise HN. As a result, the value of the level-adjustment coefficient LD can be set almost without the need to take the level of the high-frequency noise HN into consideration.

In this way, it is a matter of course that the level (the degree of modulation) of the signal component S in the audible band can be lowered. In addition, the signal component S in the audible band after the level adjustment can be settled at the maximum degree of modulation Mmax and, on the top of that, if the increase in level from the input is in a range of about +12 dB, the level of the signal component S in the audible band can be raised with hardly degrading TD+N.

That is to say, as long as the level of the signal component S in the audible band included in the digital audio data DD2 is equal to or lower than the maximum input level ILmax, the level-adjustment coefficient LD can be set at a value of equal to or greater than unity. In this way, it is possible to raise the level of the signal component S in the audible band.

Next, a second embodiment of the present invention is explained.

The data processing apparatus provided by the first embodiment of the present invention is applied to a level adjusting apparatus. On the other hand, the data processing apparatus provided by the second embodiment of the present invention is applied to an apparatus that has a function of eliminating a direct-current offset component and a function of adjusting the level of digital data.

Figure 10:
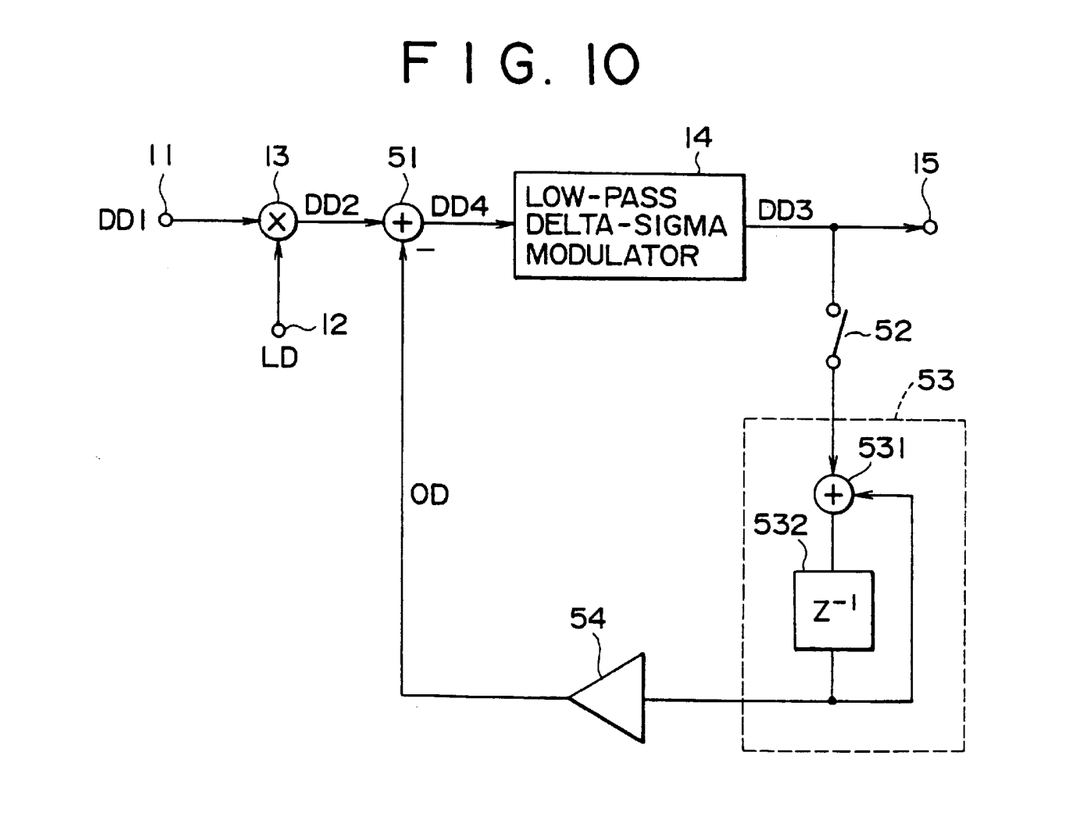
FIG. 10 is a block diagram showing the configuration of a data processing apparatus provided by a second embodiment of the present invention.

FIG. 10 is a block diagram showing the configuration of the present embodiment. The data processing apparatus shown in the figure comprises a configuration for eliminating a direct-current offset component and a configuration for adjusting the level of digital data which are independent of each other. The configuration for adjusting the level of digital data is the same as that shown in FIG. 1. For this reason, components composing the configuration for adjusting the level of digital data shown in the figure are denoted by the same reference numerals as those used in FIG. 1 and the explanation of the level adjusting configuration is therefore omitted.

The configuration shown in FIG. 10 is different from that shown in FIG. 1 in that, in the case of the former, an adder 51, a switch 52, an integrator 53 and a shifter 54 are added to the data processing apparatus shown in FIG. 1. These additional components are used for eliminating a direct-current offset component DC included in the digital audio data DD2 from the data DD2.

Here, the adder 51 has a function of subtracting data OD for eliminating the direct-current offset component DC from the digital audio data DD2. The data OD is referred to hereafter as omitting data. The switch 52 has a function of flattening the frequency characteristic of the DELTA-SIGMA modulator 14 up to the direct-current zone.

Typically comprising an adder 531 and a delay element 532, the integrator 53 has a function of integrating the digital audio data DD3 output by the DELTA-SIGMA modulator 14. The shifter 54 has a function of generating the omitting data OD by shifting an integration output of the integrator 53 in a direction of lowering the level thereof.

Next, the operation of the embodiment with the configuration described above is explained.

Now, let the value of the level-adjustment coefficient LD be 1. In this case, if the level of the digital audio data DD1 supplied to the input terminal 11 is "+1", the level of the digital audio data DD2 output by the multiplier 13 is also "+1". By the same token, if the level of the digital audio data 11 is "−1", the level of the digital audio data DD2 output by the multiplier 13 is also "−1".

The digital audio data DD2 is supplied to the adder 51 for subtracting the omitting data OD from the data DD2. The subtraction results in digital audio data DD4 with the direct-current offset component DC thereof eliminated. The digital audio data DD4 undergoes DELTA-SIGMA modulation in the DELTA-SIGMA modulator 14 for generating the digital audio data DD3 with the word length thereof restored to 1 bit.

The omitting data OD is generated as follows. When the processing is started, the switch 52 is set in an on state. In this state, the digital audio data DD3 is supplied to the integrator 53 by way of the switch 52. As a result, the digital audio data DD3 is integrated by the integrator 53.

The integrator 53 has a characteristic that, the lower the frequency, the higher the gain. For this reason, the direct-current offset component DC is integrated by the integrator 53. As a result, an integration output proportional to the level of the direct-current offset component DC is obtained.

It should be noted that the level of the integration output is much higher than the level of the direct-current offset component DC. For this reason, the integration output is shifted by the shifter 54 in such a direction that the level of integration output is lowered. As a result, omitting data OD with a level about equal to that of the direct-current offset component DC is obtained.

The switch 52 is set in such a way that it is turned off after a predetermined time has lapsed since the start of the processing. When the switch 52 is turned off, the integration carried out by the integrator 53 is also terminated as well. As a result, the level of the omitting data OD is sustained at a level which was achieved before the switch 52 is turned off.

The switch 52 is provided to preserve a flat frequency characteristic up to the direct-current zone. It means that, in actuality, the integrator 53 also integrates direct-current components other than the direct-current offset component DC and components with very low frequencies. Thus, if the integration were continued, the level of the omitting data OD would be affected by these additional components. As a result, the processing to eliminate the direct-current offset component DC would eliminate not only the direct-current offset component DC, but also the direct-current components other than the direct-current offset component DC and the components with very low frequencies. The frequency characteristic in the direct-current zone would thereby be deteriorated.

In order to solve this problem, the switch 52 is provided in the present embodiment. The switch 52 is turned on at the beginning of the processing and kept in the on state till a predetermined period of time has lapsed since the start of the processing. As the predetermined period of time lapses, the switch 52 is turned off.

According to such a configuration, by properly setting the turned-on time of the switch 52, the level of the omitting data OD can be made close to the level of the direct-current offset component DC. By so doing, even if the direct-current components other than the direct-current offset component DC and the components with very low frequencies appear at the output terminal of the multiplier 13 later on, it is possible to prevent these additional components from being inadvertently eliminated. As a result, the frequency characteristic up to the direct-current zone can be improved. To be more specific, the frequency characteristic up to the direct-current zone can be made flat.

Also in the case of the second embodiment described above in detail, a low-pass DELTA-SIGMA modulator 14 is employed as a DELTA-SIGMA modulator for changing the word length. As a result, much like the first embodiment, the processing to eliminate the direct-current offset component DC allows the level of the signal component S in the audible band to be prevented from inevitably becoming low.

According to the second embodiment, when the omitting data OD is generated by integration of the modulation output of the DELTA-SIGMA modulator 14, the integration is carried out only during a predetermined period of time. It is thus possible to prevent components other than the direct-current offset component DC and the components with very low frequencies from being inadvertently eliminated. As a result, a flat frequency characteristic up to the direct-current zone can be obtained.

Next, other embodiments are described.

It should be noted that, while the present invention has been described with reference to the first and second illustrative embodiments, the description is not intended to be construed in a limiting sense. That is to say, it is to be understood that the subject matter encompassed by the present invention is not limited to the two embodiments.

For example, in the case of the embodiments described above, digital audio data with a word length of 1 bit is processed. It should be noted, however, that the present invention can cope with digital data with a word length of 2 or more bits.

In addition, in the case of the embodiments described above, the word-length conversion apparatus provided by the present invention is applied to an application for restoring the word length of digital data, the word length of which has been changed, to the original value thereof. It is worth noting, however, that the word-length conversion apparatus provided by the present invention can be applied not only to an application for restoring the word length of digital data, the word length of which has been changed, to the original value thereof, but also to a general application for changing a word length.

Also in the case of the embodiments described above, the data processing apparatus provided by the present invention is applied to an apparatus having a function of adjusting the level of digital data and an apparatus having a function of eliminating the direct-current offset component. It should be noted, however, that the present invention can also be applied to other data processing apparatuses. To be more specific, the present invention can be applied to a general data processing apparatus for carrying out data processing which can keep up with fluctuations in word length by performing processing on digital data along with predetermined processing data.

In addition, in the case of the embodiments described above, the DELTA-SIGMA modulator is designed to exhibit a low-pass characteristic as an input/output frequency characteristic thereof. It is worth noting, however, that the DELTA-SIGMA modulator provided by the present invention can have another frequency characteristic as long as only a signal component that is naturally required is passed through thereby.

As described above, while the present invention has been described with reference to illustrative preferred embodiments, the description is not intended to be construed in a limiting sense. It is further understood by those skilled in the art that a variety of changes and modifications can thus of course be made to the present invention without departing from the true spirit and scope thereof.

As described above in detail, according to the present invention, by carrying out DELTA-SIGMA modulation on digital data, the word length of digital data can be changed. As a result, by performing processing on digital data along with predetermined processing data, the word length of the digital data can be restored to the original value thereof without degrading the accuracy of the result of the data processing even in the case of predetermined data processing carried out on digital data.

On the top of that, according to the present invention, a DELTA-SIGMA modulator having a frequency characteristic capable of passing through only a naturally desired signal component is employed as a DELTA-SIGMA modulator for changing the word length of digital data. As a result, the level of the naturally desired signal component can be raised as long as the level of the signal component is lower than the maximum input level of the DELTA-SIGMA modulator.

What is claimed is:

1. A word-length conversion apparatus for changing a word length of a digital data input signal to a predetermined value, comprising:
    a DELTA-SIGMA modulator, configured and arranged to receive a first data signal and to generate an output signal having a word length of the predetermined value; and
    a multiplier arrangement coupled to receive the digital data input signal and a level adjustment signal and configured and arranged to generate the first data signal as a function of a product of the digital data input signal and the level adjustment signal and to provide the first data signal to the DELTA-SIGMA modulator
    wherein said DELTA-SIGMA modulator is configured to eliminate quantization noise by adjusting the transfer function of said DELTA-SIGMA modulator.

2. A word-length conversion apparatus, according to claim 1, wherein said DELTA-SIGMA modulator includes a feed-forward and a feed-back element, said DELTA-SIGMA modulator being configured to eliminated to quantization noise by adjusting the transfer function of said feed-forward and feed-back elements.

3. A word-length conversion apparatus comprising:
    data processing means for processing an input digital data signal and a level adjustment signal to generate a first data signal;
    word-length conversion means, coupled to receive the first data signal, for changing a word length of the input digital data signal by performing DELTA-SIGMA modulation on the first data signal; and
    offset correction means for eliminating a direct-current offset component of the input digital data signal.

4. A word-length conversion apparatus, according to claim 3, wherein the data processing means is configured and arranged to multiply the input digital data signal by level-adjustment data represented by the level adjustment signal to adjust a level of the input digital data signal.

5. A word-length conversion apparatus, according to claim 3, wherein the data processing means comprises:
    removing-data generating means for generating removing data for eliminating the direct-current offset component of the input digital data signal; and
    subtracting means for subtracting the removing data from the input digital data signal to eliminate the direct-current offset component of the input digital data signal.

6. A word-length conversion apparatus, according to claim 5, wherein the removing-data generating means generates the removing data as a function of a conversion result output by the word-length conversion means.

7. A word-length conversion apparatus, according to claim 6, wherein the removing-data generating means generates the removing data during a selected time interval and, after the selected time interval has lapsed, continuously outputs the removing data generated during the selected time interval.

8. A data processing apparatus comprising:
    a multiplier arrangement, configured and arranged to receive an input digital data signal and a level adjustment signal and to generate a level-adjusted data signal as a product of the input digital data signal and the level adjustment signal;
    a first DELTA-SIGMA modulator coupled to receive the level-adjusted data signal and configured and arranged to perform DELTA-SIGMA modulation on the digital data signal and to generate a modulated signal based on the DELTA-SIGMA modulation;
    a processing unit coupled to receive the modulated signal from the first DELTA-SIGMA modulator and configured and arranged to process the modulated signal to generate an output digital data signal as a function thereof;
    a control unit for controlling the processing unit; and
    a second DELTA-SIGMA modulator, configured and arranged to perform DELTA-SIGMA modulation on the output digital data signal.

9. A data processing apparatus, according to claim 8, wherein the second DELTA-SIGMA modulator has a filter characteristic.

10. A data processing apparatus, according to claim 9, wherein the second DELTA-SIGMA modulator has a low-pass filter characteristic.

11. A data processing apparatus, according to claim 7, wherein the control unit is configured and arranged to adjust a level of the output digital data signal.

12. A data processing apparatus, according to claim 8, wherein said processing unit comprises a multiplier.

13. A data processing apparatus, according to claim 12, wherein the control unit is configured and arranged to control a level-adjustment coefficient received by the processing unit.

14. A data processing apparatus comprising:
    a multiplier arrangement, configured and arranged to receive an input digital data signal and a level adjustment signal and to generate a level-adjusted data signal as a product of the input digital data signal and the level adjustment signal;
    a first DELTA-SIGMA modulator coupled to receive the level-adjusted data signal and configured and arranged to perform DELTA-SIGMA modulation on the digital data signal and to generate a modulated signal based on the DELTA-SIGMA modulation;
    a processing unit coupled to receive the modulated signal from the first DELTA-SIGMA modulator and configured and arranged to process the modulated signal to generate an output digital data signal as a function thereof;
    a control unit for controlling the processing unit; and
    a second DELTA-SIGMA modulator comprising a plurality of multipliers having predetermined coefficients and configured and arranged to multiply the output digital data signal by the predetermined coefficients.

15. A data processing apparatus, according to claim 14, wherein the second DELTA-SIGMA modulator has a filter characteristic.

16. A data processing apparatus, according to claim 15, wherein the second DELTA-SIGMA modulator has a low-pass filter characteristic.

17. A data processing apparatus, according to claim 14, wherein the control unit is configured and arranged to adjust a level of the output digital data signal.

18. A data processing apparatus, according to claim 14, wherein the processing unit comprises a multiplier.

19. A data processing apparatus, according to claim 18, wherein the control unit is configured and arranged to control a level-adjustment coefficient received by the processing unit.

20. A data processing apparatus, according to claim 14, wherein the coefficients of said multipliers employed in the second DELTA-SIGMA multiplier have values of ½(n), where n is a positive integer.

21. A data processing apparatus, according to claim 20, wherein n is a positive integer between 1 and 4, inclusive.

22. A data processing apparatus comprising:
   a first processing unit coupled to receive a digital input signal and configured and arranged to output a level-adjusted signal generated as a function of the digital input signal and a level adjustment signal;
   a second processing unit for processing the level-adjusted signal to generate a first output signal;
   a DELTA-SIGMA modulator for modulating the first output signal to generate a modulated signal;
   switch means coupled to receive the modulated signal and to generate a second output signal;
   an integrator for processing the second output signal to generate an integrated signal; and
   a third processing unit for processing the integrated signal to generate a processed integrated signal and to provide the processed integrated signal to the first processing unit.

23. A data processing apparatus, according to claim 22, wherein the first processing unit comprises a multiplier.

24. A data processing apparatus, according to claim 22, wherein the second processing unit comprises an adder for removing a direct-current offset from the level-adjusted signal.

25. A data processing apparatus, according to claim 22, wherein the DELTA-SIGMA modulator has a low-pass filter characteristic.

26. A data processing apparatus, according to claim 22, wherein the third processing unit comprises a digital shifter.

27. A data processing apparatus, comprising:
   a first processing unit for inputting a digital signal and outputting said digital signal with the level thereof adjusted;
   a second processing unit for processing said digital signal output by said first processing unit, the second processing unit comprising an adder for removing a direct-current offset;
   a DELTA-SIGMA modulator for modulating a digital signal output by said second processing unit;
   a switch means connected to the output terminal of said DELTA-SIGMA modulator;
   an integrator for processing a signal output by said switch means; and
   a third processing unit for processing data output by said integrator and outputting a processing result to said first processing unit.

28. A data processing apparatus, comprising:
   a first processing unit for inputting a digital signal and outputting said digital signal with the level thereof adjusted;
   a second processing unit for processing said digital signal output by said first processing unit;
   a DELTA-SIGMA modulator for modulating a digital signal output by said second processing unit, the DELTA-SIGMA modulator having a low-pass filter characteristic;
   a switch means connected to the output terminal of said DELTA-SIGMA modulator;
   an integrator for processing a signal output by said switch means; and
   a third processing unit for processing data output by said integrator and outputting a processing result to said first processing unit.

29. A data processing apparatus, comprising:
   a first processing unit for inputting a digital signal and outputting said digital signal with the level thereof adjusted;
   a second processing unit for processing said digital signal output by said first processing unit, the second processing unit comprising an adder for removing a direct-current offset;
   a DELTA-SIGMA modulator for modulating a digital signal output by said second processing unit;
   a switch means connected to the output terminal of said DELTA-SIGMA modulator;
   an integrator for processing a signal output by said switch means; and
   a third processing unit for processing data output by said integrator and outputting a processing result to said first processing unit, the third processing unit comprising a digital shifter.

* * * * *